United States Patent [19]

Ernsberger

[11] 4,285,988
[45] Aug. 25, 1981

[54] STAINED GLASS PHOTOMASKS AND METHOD OF MAKING BY ELECTRODEALKALIZATION

[75] Inventor: Fred M. Ernsberger, Pittsburgh, Pa.

[73] Assignee: PPG Industries, Inc., Pittsburgh, Pa.

[21] Appl. No.: 60,422

[22] Filed: Jul. 25, 1979

Related U.S. Application Data

[63] Continuation of Ser. No. 856,144, Nov. 30, 1977, abandoned.

[51] Int. Cl.³ .............. B05D 5/12; B05D 1/36
[52] U.S. Cl. .................. 427/12; 65/30 E; 204/180 R; 427/96; 427/205; 427/261; 427/282; 428/210; 430/5; 430/321
[58] Field of Search .............. 428/210, 38; 427/12, 427/96, 282, 166, 205, 261; 156/652; 204/180 R; 65/30 E; 430/5, 321

[56] References Cited

U.S. PATENT DOCUMENTS

| 2,455,719 | 12/1948 | Weyl et al. | 65/30 E X |
| 2,927,042 | 3/1960 | Hall et al. | 428/38 |
| 3,510,371 | 5/1970 | Frankson | 156/652 |
| 3,561,963 | 2/1971 | Kiba | 430/5 |
| 3,573,948 | 4/1971 | Tarnopol | 427/96 |
| 3,620,795 | 11/1971 | Kiba | 427/12 |
| 3,653,864 | 4/1972 | Rothermel et al. | 65/30 E |
| 3,732,792 | 5/1973 | Tarnopol et al. | 428/210 |
| 3,811,855 | 5/1974 | Carlson et al. | 65/30 E |
| 3,836,348 | 9/1974 | Sumimoto et al. | 65/30 E |
| 3,902,882 | 9/1975 | Loukes et al. | 65/30 E |
| 3,905,791 | 9/1975 | Plumat et al. | 65/30 E |
| 3,933,609 | 1/1976 | Bokov et al. | 204/180 R |
| 3,991,227 | 5/1976 | Carlson et al. | 427/205 X |
| 3,991,228 | 5/1976 | Carlson et al. | 427/166 X |
| 4,113,486 | 9/1978 | Sato | 430/321 |
| 4,144,066 | 3/1979 | Ernsberger | 428/38 X |
| 4,155,735 | 5/1979 | Ernsberger | 65/30 E |

Primary Examiner—Thomas J. Herbert, Jr.
Attorney, Agent, or Firm—Dennis G. Millman

[57] ABSTRACT

Glass photomasks having a stained pattern within the glass for use in photolithographic processes are made by dealkalizing surface zones of a glass sheet in a predetermined pattern by means of an electric field and subsequently injecting stain-producing ions, such as silver and/or copper, into the non-dealkalized zones of the glass.

11 Claims, 18 Drawing Figures

 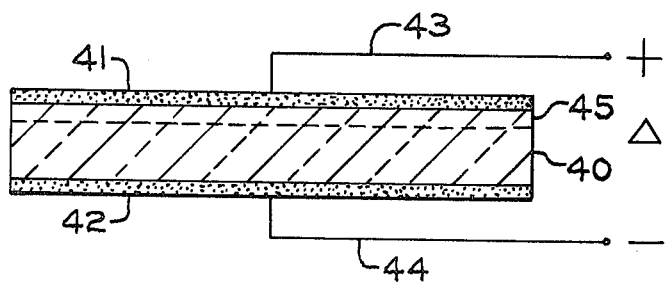
 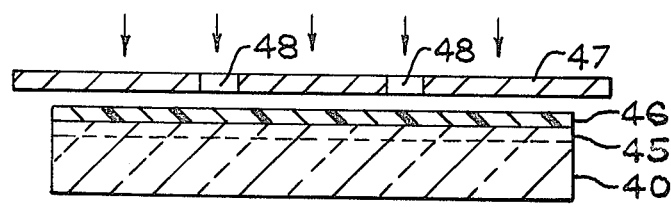
 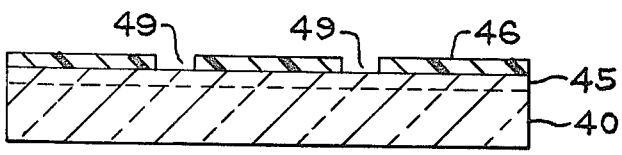
 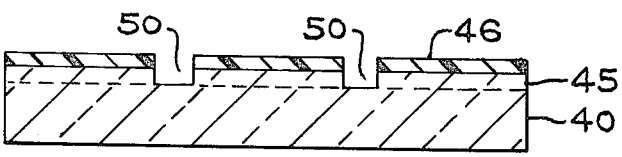
 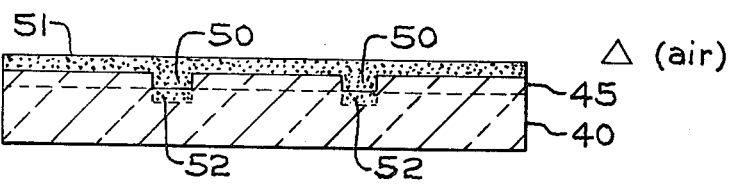
 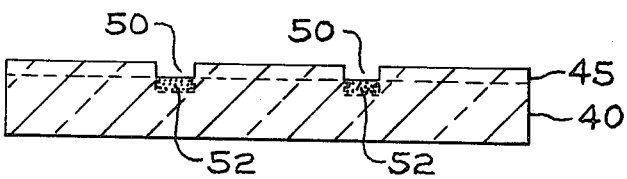

STAINED GLASS PHOTOMASKS AND METHOD OF MAKING BY ELECTRODEALKALIZATION

This is a continuation of application Ser. No. 856,144, filed Nov. 30, 1977, now abandoned.

BACKGROUND OF THE INVENTION

Photomasks are used in the art of photolithography for printing microelectronic circuits and other precision photofabricated parts, such as television shadow masks. In a photolithographic process a substrate is covered with a layer of photoresist in which a pattern is photographically developed by superimposing over the photoresist a photomask having patterned transparent and opaque areas, and then passing actinic radiation, especially ultraviolet light, through the transparent areas of the photomask. A pattern is then developed in the photoresist as a relief image by means of the differential solubilities of the exposed and unexposed portions. The resulting image may be either a negative image or a positive image of the photomask, depending upon whether the photoresist is "negative-working" or "positive-working." Etching or other treatments may then be carried out on the underlying exposed portions of the substrate. A general discussion of the state of the art of photofabrication and the role played by photomasks may be found in *Scientific American,* September 1977, pages 111-128.

Since the preparation of a photomask can be laborious and costly, it is desirable for each photomask to be reused many times in the manufacture of photofabricated devices. Therefore, a photomask should be sufficiently durable to withstand extensive use, handling, and occasional cleaning without damage to the precision pattern it carries. It is also highly desirable to maximize the resolution of the pattern carried by a photomask so as to improve the accuracy of the image it imparts to the photofabricated devices being manufactured, which in turn permits further miniaturization of microcircuits and the like.

Photomasks in the prior art have typically consisted of sheets of glass carrying patterned coatings on their surfaces. Photographic emulsion, iron oxide, and chromium are the films most commonly used. While iron oxide and chromium are considerably more durable than photographic emulsion coatings, all three, by their very nature as coatings, are susceptible to scratching and other damage which shortens the useful life of the photomasks. Also, the etching required to produce a desired pattern in iron oxide or chromium films entails a loss of resolution due to the so-called "etch factor," which means that an etched groove grows wider as it grows deeper. This may be lessened by reducing the film thickness, but with a sacrifice in durability. Moreover, chromium films have the drawbacks of being opaque, which is a disadvantage when aligning the photomask with the substrate being processed, and of being reflective, which causes undesirable light scattering.

Photomasks of improved durability were proposed in U.S. Pat. No. 3,573,948 to M. S. Tarnopol and U.S. Pat. No. 3,732,792 to M. S. Tarnopol et al., wherein instead of a coating on the surface of a glass sheet, the opaque areas of the photomask are produced by a stained pattern within the glass. While such stained glass photomasks represent a great improvement in durability, the degree of pattern resolution is less than what is desired for some applications. The limited resolution of the stained masks of the aforementioned patents arises from the necessity in one case to deeply etch the pattern through a stained layer of the glass, and in the other case to etch through a difficult-to-remove tin oxide coating, as well as the tendency in all cases for a thermally migrated stain to spread laterally from the stained areas into the adjacent unstained areas during the staining process. A stained glass photomask is also shown in U.S. Pat. No. 3,561,963 to W. M. Kiba where the desired pattern is etched into a copper film on the glass substrate and copper ions are then migrated into the glass by heating. In U.S. Pat. No. 3,933,609 to J. S. Bokov et al. the photomask is made by staining the entire surface of a sheet of glass and then selectively etching away portions of the stained layer.

Attempts to minimize lateral diffusion of the staining ions within the glass are disclosed in U.S. Pat. Nos. 2,927,042 to A. J. C. Hall et al. and 3,620,795 to W. M. Kiba. In those patents, stain-producing metal ions are migrated into glass to produce stained patterns therein by applying an electric field through the glass in the desired direction of ion migration while maintaining the glass at an elevated temperature.

SUMMARY OF THE INVENTION

It has now been found that a high resolution, stained photomask pattern may be created in a sheet of glass by electrodealkalizing selected portions of the glass surface so as to render them unreceptive to stain-producing ions, and then staining the remaining portions of the glass surface. By electrodealkalization is meant that mobile cations in the glass, especially alkali metal ions such as sodium, potassium, and lithium, are depleted in a surface layer of the glass and replaced under certain conditions with relatively immobile ions, such as $H^+$. Since the injection of stain-producing ions into the silicon-oxygen matrix of glass requires the presence of sites left by mobile cations, dealkalized zones in a piece of glass will not accept stain-producing ions and will remain relatively transparent while adjacent areas of the glass not subjected to dealkalization become colored and highly absorbing to certain wavelengths of radiation. Moreover, it has been found that sharply defined patterns of dealkalization can be produced on a piece of glass by either of two methods. A preferred method is to dealkalize through the apertures of a developed photoresist by imposing an electric field across the thickness of the glass at a moderately elevated temperature. Instead of a photoresist, a patterned non-conductive film, such as iron oxide, may be used. An alternate method for developing dealkalized patterns on a piece of glass involves dealkalizing a surface layer of glass across the entire area of a surface of the glass and then etching away the very thin dealkalized layer in the areas that are desired to be stained, employing a conventional photoetching process.

THE DRAWINGS

FIGS. 3 (a through f) shows schematically a series of steps in an alternate method of producing a stained glass photomask wherein a uniformly dealkalized glass surface is etched in the pattern desired and then stained in the etched portions.

In all of the drawings, it should be understood that thickness and proportions of many of the layers have been shown greatly exaggerated for the purpose of illustration.

DETAILED DESCRIPTION

The substrates upon which the photomasks of the present invention are based are transparent sheets of glass. Composition of the glass is not critical so long as it contains mobile cations capable of being electromigrated at moderate voltages and which provide sites into which stain-producing ions may be injected. Alkali metal ions such as sodium, potassium, and lithium have relatively high mobility in glass, and thus glasses having at least minor amounts of alkali metal oxides are particularly useful. For example, conventional soda-lime-silica flat glass compositions typically include about 10 to 13 percent by weight sodium oxide and often a trace of potassium oxide, which represents a more than ample supply of mobile cations for practice of the present invention. Borosilicate glass compositions having much lower alkali metal oxide concentrations have been used for coated photomask substrates and may be used with the present invention provided that an adequate stain intensity is produced to suit the particular needs of the photomask user. Also usable are commercially available glass compositions formulated for enhanced ion exchange properties and which are characterized by a substantial amount of aluminum oxide and/or zirconium oxide.

Figure 1A:
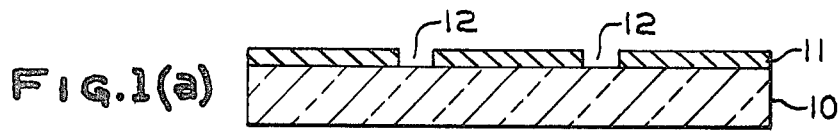
FIGS. 1 (*a* through *f*) shows schematically the process steps of a preferred embodiment of producing a stained glass photomask by means of electrodealkalization and then staining with a paste-type self-reducing stain.

Referring now to the particular embodiment of FIG. 1, there is shown in FIG. 1(a) a glass substrate 10 coated with a film 11 which masks ionic electromigration by virtue of its relatively low electrical conductivity. Examples of suitable films are organic photoresist, iron oxide, and silicon dioxide. Nonconductive film 11 is provided with a pattern of apertures 12 by a preceding conventional photolithographic process (not shown). For example, the method of FIG. 1 may be considered as starting in FIG. 1(a) with a conventional iron oxide photomask or the like as presently employed by the photofabricating art, whereby the subsequent steps of FIG. 1 represent a method of converting the iron oxide coated photomask into a permanently stained photomask. Alternatively, the nonconductive film 11 may be a photoresist, in which case the apertures 12 may be developed in the manner to be described hereinafter in connection with FIGS. 2(a) through 2(c).

Figure 1B:
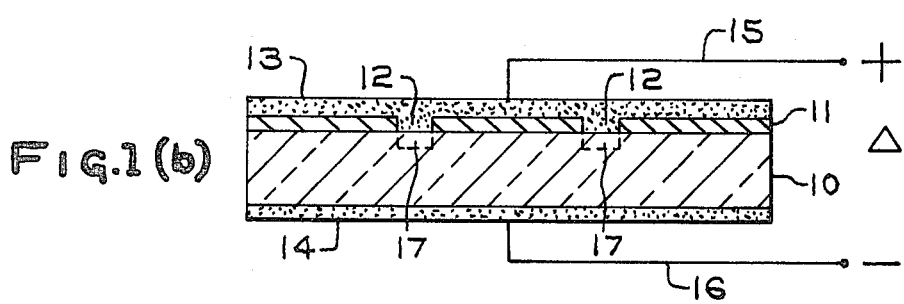
Figure 2A:
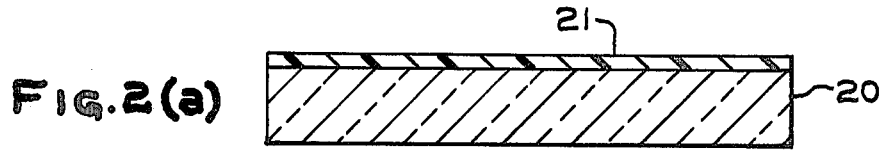
FIGS. 2 (*a* through *f*) shows schematically a series of steps by which a stained glass photomask may be produced by electrodealkalization followed by staining with ions electromigrated from a metal film.

FIG. 1(b) depicts the electrodealkalization step, for which a conductive layer 13 has been applied over the patterned nonconductive film 11, and another conductive layer 14 has been applied to the opposite surface of the glass. Layers 13 and 14 serve as anode and cathode respectively when they are connected to a source of electrical potential by means of leads 15 and 16. Layer 13 consists of a material which will act as a "blocking electrode," that is, it is conductive but is not a source of cations which might be injected into the glass by the application of an electric field. It is also desirable for layer 13 to be somewhat porous to permit gaseous participants in the dealkalization process to pass therethrough. The preferred material for use as the blocking electrode is colloidal graphite because of its low cost and ease of application, but other materials could be used such as colloidal particles of platinum, rhodium, silicon, palladium, iridium, and molybdenum disilicide. Cathode 14 need not be a blocking electrode and thus may consist of any conductive film such as a metal film deposited by sputtering or any other known technique. However, for convenience, layer 14 is also preferably colloidal graphite. The colloidal graphite layers may be applied to the substrate in slurry form in which the colloidal graphite is suspended in an aqueous or alcoholic vehicle, or the layers may be applied by means of commercially available aerosol sprays of colloidal graphite. The only requirement as to the thickness of graphite layers 13 and 14 is that they be sufficiently thick to render their resistance insignificant relative to the resistance of the glass (e.g., less than about 10 percent).

When a D.C. voltage is applied between electrode layers 13 and 14 with 13 as the anode, mobile cations within the portions of the glass underlying apertures 12 in the masking film 11 migrate away from the anode to form a pattern of ion depleted zones 17 within the glass at the anode surface. Since the migrating ions are chiefly alkali metal ions, zones 17 within the glass have thereby become "dealkalized." The portions of the glass underlying nonconductive film 11, on the other hand, remain substantially unchanged. Voltage and temperature during dealkalization are determined largely by the rate desired for dealkalization. At room temperature and a potential of only a few volts, dealkalization would be so slow as to be virtually imperceptible. Therefore, elevated temperatures of at least about 100° C. and several hundred volts are preferred for the sake of more practical processing times. For example, temperatures of about 160° C. to about 200° C. at a potential of 300 to 400 volts have been found to be satisfactory. Temperatures up to about 600° C. may be used without causing oxidation of the graphite layers, but even higher temperatures may be employed if the dealkalization step is carried out in a non-oxidizing atmosphere to prevent the graphite layers from burning off. However, temperatures above 200° C. are not preferred because the resistance of the nonconductive masking film 11 can be reduced at elevated temperatures, which tends to permit dealkalization to take place in the glass portions underlying the masking film. Also, when the masking film 11 is organic photoresist, a temperature of about 200° C. has been found to be the approximate upper limit beyond which temperature some organic photoresists begin to melt or decompose. This will vary somewhat, however, depending upon the particular photoresist being used. The temperature also influences the voltage required since the conductivity of glass increases with higher temperatures. Voltages so high as to cause arcing through the glass must be avoided. Additional information regarding electrodealkalization of glass per se may be found in U.S. Pat. No. 3,811,855 to D. E. Carlson et al. and in U.S. Pat. No. 3,896,016 to L. A. Goodman et al., the disclosures of which are hereby incorporated by reference.

During electrodealkalization, as the positively charged alkali metal cations in zones 17 of the glass are repelled from the anode, an unbalanced charge begins to develop in those zones. Although it is not known for certain, it appears that either or both of two mechanisms for compensating the unbalanced charge take place. In an atmosphere essentially free from water vapor, it has been hypothesized that non-bridging oxygen molecules from the glass matrix migrate toward the anode where they evolve as oxygen gas which diffuses through the porous graphite electrode. As a result, zones 17 experience a net loss of alkali metal oxide and thus a loss of sites for subsequently injecting stain-producing cations. However, under normal atmospheric conditions with a small amount of water vapor in the air, probably the predominant mechanism is that protons dissociate from atmospheric water which has diffused through the porous graphite anode and are injected into the glass so as to occupy the sites vacated by the displaced alkali metal ions. The protons which take the place of the alkali metal cations in the glass are considerably less mobile and thus are not susceptible to being replaced by stain-producing cations. It is possible that under some conditions both mechanisms take place simultaneously.

Figure 1C:
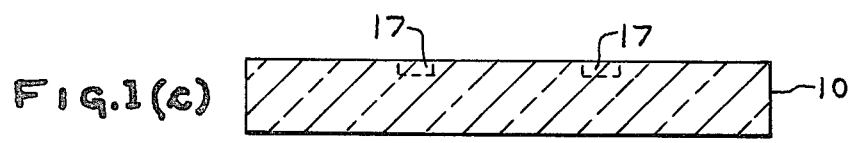

When the electrode layers 13 and 14 and the masking film 11 are removed from the glass substrate as shown in FIG. 1(c), what remains consists entirely of a glass plate which appears to be entirely transparent, but which carries within its surface a latent image pattern due to the presence of dealkalized zones 17 which will shun being stained while the remainder of the glass surface remains capable of being stained. The dealkalized zones produced by the electrodealkalization process of the present invention have been found to have remarkably distinct boundaries, the sides extending nearly perpendicularly from the top surface of the glass. Depletion of alkali metal ions within the dealkalized zones is believed to be nearly complete, and the depth to which the dealkalized zones extend into the glass appears to be quite uniform and distinct. This depth is a function of the amount of current passed through a given area of glass. For standard soda-lime-silica float glass, the depth of dealkalization will be approximately one micron for each 0.1003 Coulomb per square centimeter consumed by the electrodealkalization process. The desired depth of dealkalization will depend upon the particular requirements of a given application, but a depth of about one micron, for example, has been found to sufficiently block staining in the dealkalized areas of the glass to yield satisfactory contrast between the stained and unstained areas for most purposes. At the stage of the process shown in FIG. 1(c), it may be desirable in some cases to subject the glass to a light etching so as to remove a very thin layer of dealkalized glass from the areas to be stained which may have resulted from some slight conductivity of the essentially nonconductive masking film 11. Any known glass etchant, such as diluted aqueous hydrofluoric acid, may be used.

Figure 1D:
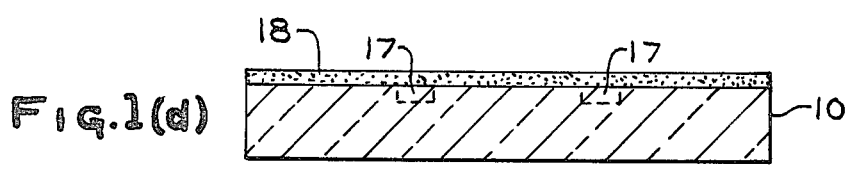
Figure 1E:
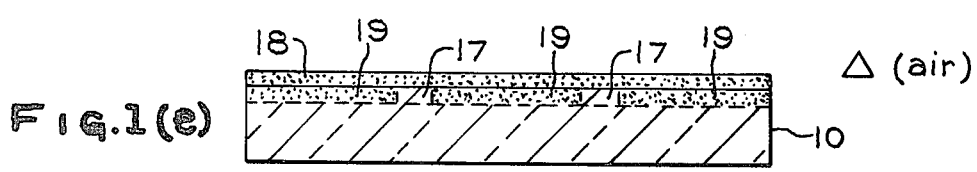
Figure 1F:
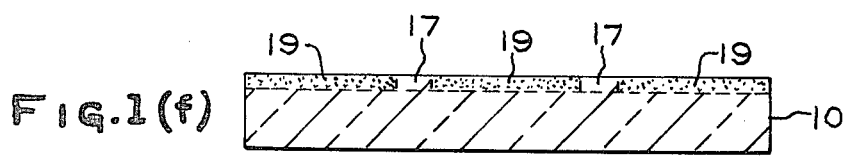

After dealkalized patterns have been produced in the glass and the coatings removed, the glass substrate is stained by any known technique. Referring to FIG. 1(d), there is shown a layer 18 of a paste-type staining composition applied to the surface of the glass. Such staining compositions are commercially available and typically contain a source of silver and/or copper ions as the stain-producing ions, although gold or thallium ions may also be used. An example of such a stain is "Drakenfeld M404," a proprietary composition sold by the Drakenfeld Colors Division of Hercules, Inc., Washington, Pennsylvania, and which is believed to contain both silver and copper ions, a reducing agent, inert thickeners and extenders, and a hydrocarbon vehicle. In order to impart a radiation-absorbing stain to the glass, first an exchange of stain-producing ions for mobile cations in the glass must be effected, then the stain-producing ions must be reduced to their atomic state and agglomerated into metallic droplets of submicroscopic size. With the above-mentioned Drakenfeld stain composition or the like, these steps are accomplished merely by heating to a temperature of at least about 200° C., preferably about 400° to 500° C. Because the stain composition includes a reducing agent, reduction takes place simultaneously with ion exchange and agglomeration, and the heating may be carried out in an uncontrolled atmosphere. If a source of stain-producing ions without a reducing agent is used, reduction of the stain ions must be carried out by heating in the presence of a reducing agent, for example, by heating in a hydrogen-containing atmosphere. As shown in FIG. 1(e), the stain developing step produces colored areas 19 in the non-dealkalized portions of the glass, while the dealkalized pattern 17 remains unstained. Removal of the staining composition from the glass yields the finished, stained, all-glass photomask as shown in FIG. 1(f). It should be noted that the photomask of FIG. 1(f) has precisely duplicated the pattern begun with in FIG. 1(a), but that the pattern is now located within the body of the glass and is as durable as the glass itself rather than a fragile coating on the surface of the glass.

The opacity of the stained areas of the photomask is determined by the amount of staining ion introduced into the glass, which in turn can be controlled by the length and conditions of the staining process. In the ultraviolet range of wavelengths (3000 to 4000 Angstroms) most commonly used in photolithographic processes, a glass stain of the type disclosed here can readily achieve a transmittance of less than one percent. At the same time, the stained areas remain sufficiently transparent in the visible wavelength spectrum (e.g., about 10% or more) to aid an operator in aligning the photomask with a substrate to be printed. The unstained areas of the photomask, of course, retain the radiation transmittance properties of the base glass from which it is made, which may typically be at least an order of magnitude more transparent than the stained areas in the ultraviolet range.

The fact that the process of FIG. 1 permits the use of commercial stain compositions can be a significant advantage due to the ease with which such stain compositions can be applied and developed. However, alternate methods for staining glass may be used, such as electromigrating ions from a metallic film as will be described more fully hereinafter in connection with FIG. 2 (e and f).

Turning now to FIG. 2, there is shown stepwise a second mode for carrying out the method of the present invention. In FIG. 2(a) glass substrate 20 is first coated with an organic photoresist 21. Photoresists are well known in the art and need not be discussed at great length here for an understanding of the present invention. In general, a photoresist may be defined as a resinous material which, upon exposure to actinic radiation (usually ultraviolet light) develops areas insoluble in a particular solvent and other areas which are soluble in that solvent. A detailed discussion of photoresists may be found in *Annual Review of Materials Science*, 1976, edited by Huggins, Bube, and Roberts, Vol. 6, pages 267 through 302, which is hereby incorporated by reference. Examples of commercially available photoresists usable with the present invention are: "LSI 195" photoresist sold by Philip A. Hunt Co., "KPR" photoresist sold by Eastman Kodak Co., and "AZ-111" photoresist sold by Shipley Co.

Figure 2B:
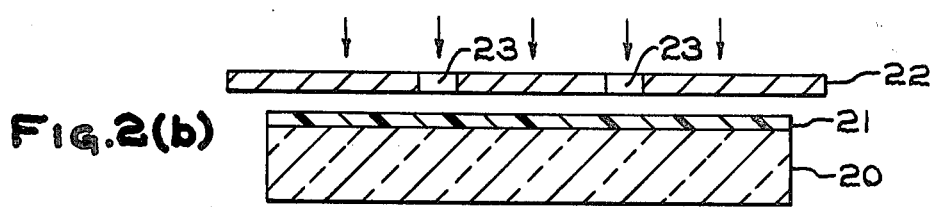
Figure 2C:
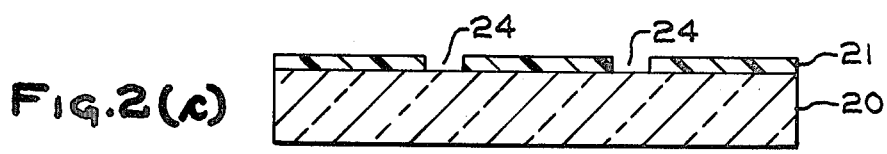
Figure 2D:
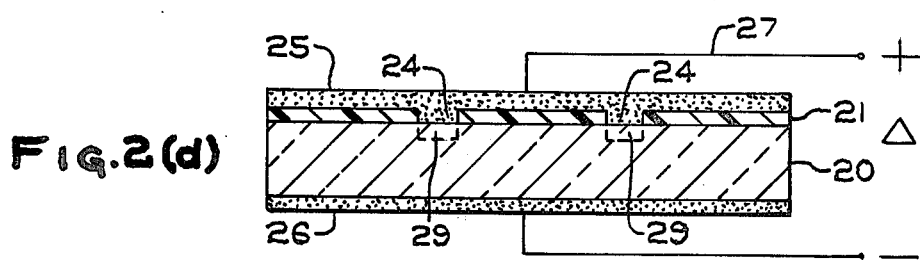
Figure 2E:
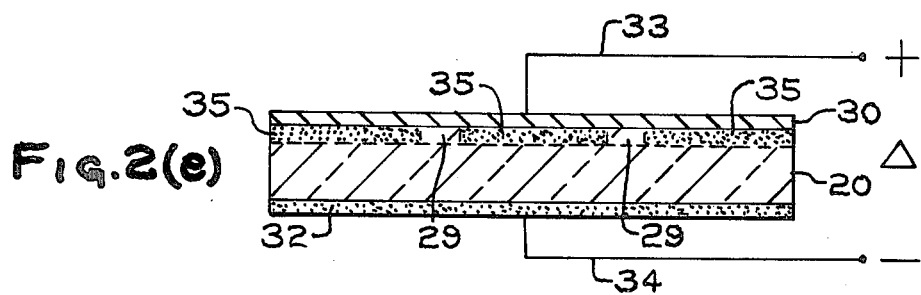
Figure 2F:
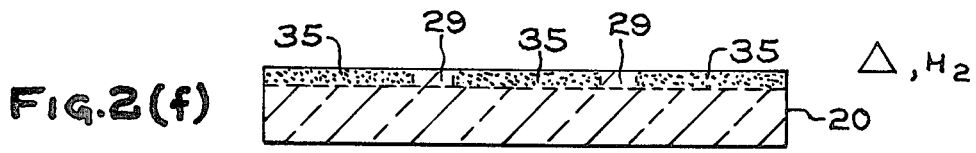

In FIG. 2(b) the photoresist 21 is developed by exposing it to radiation through a master mask 22 having patterned apertures 23. The photoresist shown in all of the drawings is a "positive-working" photoresist. Thus, when the development of the photoresist is completed, as shown in FIG. 2(c), the photoresist has been dissolved from portions 24 which correspond to the patterned apertures 23 in the master mask, while the remainder of the photoresist remains. It should be apparent that a "negative-working" photoresist may be used instead, in which case photoresist would remain only in the light-exposed areas 24 after development. After the photoresist has been developed, electrodealkalization may be carried out through the apertures 24 in the photoresist in the same manner disclosed in connection with FIG. 1(b) above. As depicted in FIG. 2(d), a preferred mode of electrodealkalization is to apply colloidal graphite electrode layers 25 and 26 to opposite sides of the resist-coated glass substrate and to apply an electrical potential between the electrode layers through leads 27 and 28 with electrode layer 25 as the anode. The combined application of an electric field and heat (as explained previously, usually no more than about 200° C. to avoid decomposing the organic photoresist) yields sharply defined dealkalized zones of glass 29 underlying openings 24 in the photoresist. At this point, the graphite layers and the photoresist may be stripped from the glass substrate and the glass stained by any suitable technique, such as the application of a commercial stain composition as disclosed in connection with FIGS. 1(d) and 1(e), or an electromigration technique as pictured in FIG. 2(e) may be employed. In the latter case, a thin film 30 of a metal or metal oxide or salt whose cations have appreciable mobility in glass and which may be agglomerated to form a stain within the glass (preferably silver or copper) is first deposited onto the dealkalized side of the glass substrate. Depositing the film may be carried out by evaporating, sputtering, or any other known process for applying a thin, uniform film onto a substrate. If the oxide or salt is used and is insufficiently conductive, the film may be covered with a layer of electrically conductive material, such as colloidal graphite. A conductive layer 32, preferably colloidal graphite, is applied to the opposite side of the glass substrate. Lead 33 is then connected to the metal film 30 and lead 34 is connected to the conductive layer 32 and an electric field applied therebetween with the film 30 serving as the anode. Heat is applied as in the case of electrodealkalization in order to enhance the mobility of the ions within the glass, preferably at a temperature above 100° C., but no higher than about 600° C. to prevent oxidation of graphite layer 32. Higher temperatures may be employed if, instead of graphite, cathode 32 is a metal film, and even higher temperatures (up to the deformation temperature of the glass) may be used if the process is carried out in a protective reducing atmosphere. Again, voltage depends upon the temperature and the speed desired, 300 to 400 volts, for example, producing reasonable treatment times for most purposes. Under the influece of the heat and the electric field, metallic ions from film 30 migrate into zones 35 where they replace mobile cations, such as alkali metal ions, which migrate deeper into the glass toward the cathode 32. In the dealkalized zones 29 the absence of relatively mobile cations precludes the establishment of a current flow and thus, little or no migration of metallic ions from film 30 into these dealkalized regions occurs. Upon removal of the electrode layers and the metal film 30, the remaining glass substrate as shown in FIG. 2(f) carries within it a latent but still colorless image. Development of the stained coloration in the ion penetration zones 35 requires reduction of the ions to their metallic state and agglomeration into submicroscopic crystals, which can be conveniently carried out, for example, by heating to about 400° to 500° C. in a reducing atmosphere.

FIG. 3 shows a sequence of steps illustrative of yet another embodiment of the present invention. In contrast to the embodiments of FIGS. 1 and 2 where positive images of the original master pattern are produced, the FIG. 3 approach yeilds a negative image. In this embodiment the first step is the uniform dealkalization of one entire surface of the glass substrate 40, such as by electrodealkalization as depicted in FIG. 3(a). There, conductive layers 41 and 42, preferably graphite, are applied to opposite sides of the glass substrate 40, and by means of leads 43 and 44 a D.C. electrical potential is applied across the glass at an elevated temperature (at least 100° C., preferably 160° C. to 200° C. when graphite is used as electrode layers 41 and 42, higher if metal films are used as the electrode layers). Mobile cations, especially alkali metal ions, within the surface portion of the glass are repelled by the anode, and thus a dealkalized surface region 45 is developed across the entire surface on the anode side of the glass substrate 40. Another possible technique for at least partially dealkalizing an entire glass surface is to coat the surface with a clay substance or the like which will withdraw alkali metal ions from the adjacent surface regions of the glass when heated, as taught in U.S. Pat. No. 2,455,719 to W. A. Weyl et al.

After the entire surface has been dealkalized, a photoresist 46 is applied to the dealkalized side of the glass substrate 40 as shown in FIG. 3(b). A pattern is then developed in the photoresist by exposure to radiation through apertures 48 in master mask 47. In FIG. 3(c) the soluble portions of photoresist 46 have been removed, leaving patterned openings 49 in the photoresist. The underlying portions of the glass may then be etched through openings 49 to a depth sufficient to remove the dealkalized glass layer from underlying zones 50. The dealkalized layer typically needs to be on the order of about one micron in thickness in order to prevent staining of the underlying portions of the glass, and thus the etching of dealkalized glass in zones 50 would be carried out to approximately that same depth. The etching stage of the process is shown in FIG. 3(d).

After etching, the photoresist 46 may be removed from the glass substrate by an appropriate solvent, after which the glass is ready to be stained. Any of the staining techniques discussed above in connection with the previous embodiments may be employed, the most convenient technique being the use of a commercially prepared stain composition. In FIG. 3(e) a layer 51 of stain composition is shown applied to the glass. Upon heating, the dealkalized surface portion of the glass 45 will resist staining, but in the etched portions 50, where the dealkalized glass has been removed to expose glass of the original composition thereunder, ion exchange will take place between the alkali metal ions in the glass and the stain-producing cations in the stain composition. As a result, stained zones 52 within the glass will develop directly beneath the etched portions 50. Upon removal of the stain composition, the completed photomask will have the appearance shown in FIG. 3(f). The resistance to scratching and wear of this embodiment is particularly enhanced since the stain pattern is not only within the body of the glass, but is recessed below the surrounding glass surfaces due to the presence of etched portions 50.

An alternate method for dealkalizing an entire glass surface for use in the method of FIG. 3 may be carried out by subjecting the glass substrate to a corona discharge as taught in U.S. Pat. No. 3,879,183 to D. E. Carlson, the disclosure of which is hereby incorporated by reference. Such a method may also be employed for the dealkalization steps of the method of FIGS. 1 and 2 provided that the temperatures are maintained low enough to avoid decomposing the masking films 11 and 21. While an iron oxide masking film may be more durable, an organic photoresist masking film may require operation of the glow discharge near the minimum temperature recommended by the Carlson patent, i.e., about 200° C.

Other modifications and variations as are known to those of skill in the art may be resorted to without departing from the spirit and scope of the invention as defined by the appended claims.

EXAMPLE

This example illustrates the embodiment of FIG. 1. The starting material was a conventional iron oxide coated photomask, a Towne Laboratories "Ferroxoplate," which was based on a glass plate 5 centimeters × 5 centimeters × 1.5 millimeters, and carried a test pattern etched in the iron oxide coating. Both sides of the plate were coated by spraying with "Aerodag G," an aerosol suspension of colloidal graphite in isopropanol sold by Acheson Colloid Co. A 5 millimeter border around the iron oxide coated side of the plate was masked from the graphite coating to prevent short-circuiting around the edges. The remaining area to be electrodealkalized was about 15.6 square centimeters.

The graphite-coated plate was then placed on an electrically heated aluminum plate, with the iron oxide coated side facing upwardly. The aluminum plate was connected to the negative terminal of a D.C. power supply, and the upper graphite layer was connected to the positive terminal of the power supply. The temperature of the plate was thermostatically controlled in the range of 135° C. to 140° C. The applied voltage was increased until the current through the sample reached 0.3 milliamperes at 245 volts, and the voltage was periodically adjusted during the 90 minute treatment to maintain the current approximately constant, ending at 380 volts.

The graphite coatings were then washed away with water, and the iron oxide coating was dissolved away with ferrous chloride etchant. Different areas of the plate were then etched for three, six, and nine minutes, respectively, in 1 percent aqueous hydrofluoric acid at room temperature.

The side of the plate which previously carried the iron oxide pattern was then covered with a brushed-on coating of "Drakenfeld M-404" stain composition, the oily carrier was evaporated in an oven at 110° C., and the coated plate was fired at 416° C. for 15 minutes. After removal from the oven, the residue of the stain composition was washed from the plate.

Stained images corresponding to the original test pattern were observed in the plate in varying degrees of intensity. In the area etched for 3 minutes there was only a faint image; in the area etched for 6 minutes the image was intense and the background colorless; and in the area etched 9 minutes there was an intense image with a slightly yellow background.

I claim:

1. A method for making a stained glass photomask comprising the steps of:
   applying a nonconductive masking film of organic photoresist onto a surface of a glass substrate containing alkali ions;
   photographically exposing and developing the photoresist masking film, thereby producing a pattern of apertures through the masking film;
   imposing a direct current electric field across the glass substrate and the apertured masking film in a direction substantially normal to said surface of the glass substrate, with the masking film side as anode, and simultaneously heating the glass substrate to at least 100° C., thereby migrating alkali metal ions out of surface portions of the glass directly underlying the apertures in the masking film toward the interior of the glass so as to yield a pattern of alkali metal on depleted areas at said surface of the glass substrate, while the masking film maintains the alkali metal ion content essentially unchanged in the remaining surface portions of the glass substrate lying directly thereunder;
   removing the masking film from said surface of the glass substrate;
   bringing a source of stain-producing cations into contact with said surface of the glass substrate under ion migrating conditions, thereby migrating the stain-producing cations into said remaining surface portions of the glass substrate, and insubstantial migration of the stain-producing ions occurs in said alkali metal ion depleted surface portions; and
   heating the glass substrate in the presence of a reducing agent to reduce and agglomerate the migrated stain-producing cations within the glass, thereby rendering the stain-producing cation migrated surface portions of the glass substantially opaque to radiation of a given wave length while said alkali metal ion depleted surface portions remain substantially transparent to said radiation.

2. The method of claim 1, wherein said step of bringing the glass into contact with a source of stain-producing ion comprises applying a paste-type stain composition to the surface of the glass, and the step of providing ion migrating conditions includes heating the glass to a temperature of at least 400° C.

3. The method of claim 1, wherein said step of bringing the glass into contact with a source of stain-producing ions includes applying a metallic film of said ion source onto said glass surface, and the ion migrating conditions include applying electrical potential across the glass with the metallic film as anode and heating the glass to at least 100° C.

4. A method for making a stained glass photomask comprising the steps of:
   applying a nonconductive masking film onto a surface of a glass substrate containing alkali metal ions;
   photographically producing a pattern of apertures through the masking film;
   imposing a direct current electric field across the glass substrate and the apertured masking film in a direction substantially normal to said surface of the glass substrate, with the masking film side as anode, and simultaneously heating the glass substrate to at least 100° C., thereby migrating alkali metal ions out of surface portions of the glass directly underlying the apertures in the masking film toward the interior of the glass so as to yield a pattern of metal ion depleted areas at said surface of the glass substrate, while the masking film maintains the alkali metal ion content essentially unchanged in the remaining surface portions of the glass substrate lying directly thereunder;

removing the masking film from said surface of the glass substrate;

spreading onto said surface of the glass substrate a fluid staining composition including a source of stain-producing cations;

subjecting the glass substrate carrying the staining composition to ion migrating conditions, thereby migrating stain-producing cations from the staining composition into said remaining surface portions of the glass substrate, and insubstantial migration of the stain-producing ions occurs in said alkali metal ion depleted surface portions; and heating the glass substrate in the presence of a reducing agent to reduce and agglomerate the migrated stain-producing cations within the glass, thereby rendering the stain-producing cation migrated surface portions of the glass substantially opaque to radiation of a given wave length while said alkali metal ion depleted surface portions remain substantially transparent to said radiation.

5. The method of claim 4, wherein said masking film is selected from the group consisting of organic photoresist, iron oxide, aluminum, and silicon dioxide.

6. The method of claim 1 or 4, wherein the stain-producing cations are selected from the group consisting of silver, copper, gold, thallium, and mixtures thereof.

7. The method of claim 1 or 4, wherein the stain producing cations comprise silver ions.

8. The method of claim 1 or 4, wherein the imposition of the electric field is carried out by applying a first conductive electrode layer over the apertured masking film, applying a second conductive electrode layer over the opposite side of the glass, and connecting said electrode layers to a source of electrical potential with said first electrode layer connected as anode.

9. The method of claim 8, wherein said electrode layers comprise colloidal graphite.

10. The method of claim 1 or 4, wherein the glass temperature during the imposition of the electric field is about 100° C. to about 200° C.

11. The method of claim 10, wherein the electric field is applied at a potential of about 300 to 400 volts D.C.

* * * * *

UNITED STATES PATENT AND TRADEMARK OFFICE
CERTIFICATE OF CORRECTION

PATENT NO. : 4,285,988
DATED : August 25, 1981
INVENTOR(S) : Fred M. Ernsberger

It is certified that error appears in the above-identified patent and that said Letters Patent are hereby corrected as shown below:

Column 10, line 8, --metal-- should be inserted after "alkali."

Column 10, line 21, "on" should be --ion--.

Column 11, line 4, --alkali-- should be inserted before "metal."

Signed and Sealed this

Twenty-fourth Day of November 1981

[SEAL]

Attest:

GERALD J. MOSSINGHOFF

Attesting Officer     Commissioner of Patents and Trademarks